(12) United States Patent
Ahmed et al.

(10) Patent No.: US 11,569,293 B2
(45) Date of Patent: *Jan. 31, 2023

(54) MICRO-LED DISPLAYS

(71) Applicant: INTEL CORPORATION, Santa Clara, CA (US)

(72) Inventors: Khaled Ahmed, Anaheim, CA (US); Kunjal Parikh, San Jose, CA (US); Peter L. Chang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/316,288

(22) Filed: May 10, 2021

(65) Prior Publication Data
US 2021/0327957 A1  Oct. 21, 2021

Related U.S. Application Data

(60) Continuation of application No. 16/878,130, filed on May 19, 2020, now Pat. No. 11,004,894, which is a continuation of application No. 16/233,787, filed on Dec. 27, 2018, now Pat. No. 10,658,422, which is a division of application No. 15/283,180, filed on Sep. 30, 2016, now Pat. No. 10,177,195.

(51) Int. Cl.
*H01L 27/15* (2006.01)
*H01L 33/00* (2010.01)
*H01L 33/18* (2010.01)

(52) U.S. Cl.
CPC ........ *H01L 27/156* (2013.01); *H01L 33/0075* (2013.01); *H01L 33/0095* (2013.01); *H01L 33/18* (2013.01)

(58) Field of Classification Search
CPC ... H01L 27/156; H01L 33/0075; H01L 33/18; H01L 33/0095
See application file for complete search history.

(56) References Cited

U.S. PATENT DOCUMENTS

| 8,735,867 | B2 | 5/2014 | Seong et al. |
| 8,835,903 | B2 | 9/2014 | Gwo et al. |
| 9,024,294 | B2 | 5/2015 | Seong et al. |

(Continued)

FOREIGN PATENT DOCUMENTS

| KR | 20120028104 A | 3/2012 |
| KR | 20140096980 A | 8/2014 |

(Continued)

OTHER PUBLICATIONS

International Search Report and Written Opinion for related PCT Application PCT/US2015/000385 filed Dec. 26, 2015 dated Sep. 22, 2016, 12 pages.

(Continued)

*Primary Examiner* — Mamadou L Diallo
(74) *Attorney, Agent, or Firm* — Hanley, Flight & Zimmerman, LLC

(57) ABSTRACT

A micro-light emitting diode (LED) display panel and a method of forming the display panel, the micro-LED display panel having a monolithically grown micro-structure including a first color micro-LED that is a first color nanowire LED, and a second color micro-LED that is a second color nanowire LED.

20 Claims, 7 Drawing Sheets

(56) References Cited

U.S. PATENT DOCUMENTS

| | | | |
|---|---|---|---|
| 9,054,233 B2 | 6/2015 | Ohlsson et al. | |
| 10,177,195 B2 | 1/2019 | Ahmed et al. | |
| 10,483,319 B2* | 11/2019 | Gardner | H01L 33/44 |
| 10,658,422 B2 | 5/2020 | Ahmed et al. | |
| 11,004,894 B2 | 5/2021 | Ahmed et al. | |
| 2011/0079796 A1* | 4/2011 | Wober | H01L 27/14 |
| | | | 257/89 |
| 2012/0061641 A1 | 3/2012 | Seong et al. | |
| 2012/0223289 A1 | 9/2012 | Gwo et al. | |
| 2014/0209859 A1 | 7/2014 | Cha et al. | |
| 2014/0363912 A1* | 12/2014 | Ohlsson | H01L 33/30 |
| | | | 438/34 |
| 2015/0092806 A1* | 4/2015 | Ning | H01S 5/041 |
| | | | 423/508 |
| 2015/0187991 A1 | 7/2015 | McGroddy et al. | |
| 2015/0221814 A1 | 8/2015 | Ohlsson et al. | |
| 2015/0372186 A1 | 12/2015 | Cha et al. | |
| 2016/0093665 A1* | 3/2016 | Schubert | H01L 27/153 |
| | | | 438/34 |
| 2017/0323925 A1* | 11/2017 | Schneider, Jr. | H01L 27/156 |
| 2017/0373046 A1* | 12/2017 | Gardner | H01L 21/6835 |
| 2020/0117027 A1* | 4/2020 | Boon | F21K 9/68 |

FOREIGN PATENT DOCUMENTS

| | | | | |
|---|---|---|---|---|
| WO | WO-2016049507 A1 * | 3/2016 | | H01L 27/15 |
| WO | 2017111827 A1 | 6/2017 | | |

OTHER PUBLICATIONS

Sekiguchi et al., "Emission Color Control From Blue to Red With Nanocolumn Diameter of InGaN/GaN Nanocolumn Arrays Grown on Same Substrate", Applied Physics Letters, 96, AIP Publishing; Jun. 2010, 3 pages.

Sekiguchi et al., "Ti-Mask Selective-Area Growth of GaN by RF-Plasma-Assisted Molecular-Beam Epitaxy for Fabricating Regularly Arranged InGan/GaN Nanocolumns", Applied Physics Express 1, Department of Engineering and Applied Sciences, Sophia University, Tokyo, Japan, Dec. 2008, 3 pages.

United States Patent and Trademark Office, "Notice of Allowance," issued in connection with U.S. Appl. No. 16/233,787, dated Jan. 17, 2020, 7 pages.

United States Patent and Trademark Office, "Non-Final Office Action," issued in connection with U.S. Appl. No. 16/233,787, dated Aug. 21, 2019, 10 pages.

United States Patent and Trademark Office, "Restriction Requirement," issued in connection with U.S. Appl. No. 15/283,180, dated Jun. 1, 2017, 7 pages.

United States Patent and Trademark Office, "Non-Final Office Action," issued in connection with U.S. Appl. No. 15/283,180, dated Aug. 9, 2017, 20 pages.

United States Patent and Trademark Office, "Notice of Allowance," issued in connection with U.S. Appl. No. 15/283,180, dated Sep. 5, 2018, 8 pages.

United States Patent and Trademark Office, "Non-Final Office Action," issued in connection with U.S. Appl. No. 16/878,130, dated Sep. 25, 2020, 6 pages.

United States Patent and Trademark Office, "Notice of Allowance and Fee(s) Due," issued in connection with U.S. Appl. No. 16/878,130, dated Jan. 14, 2021, 8 pages.

United States Patent and Trademark Office, "Notice of Allowability," issued in connection with U.S. Appl. No. 15/283,180, dated Oct. 16, 2018, 2 pages.

* cited by examiner

100

200

300

500

600

MICRO-LED DISPLAYS

RELATED APPLICATIONS

This patent arises from a continuation of U.S. patent application Ser. No. 16/878,130, filed May 19, 2020 (now U.S. Pat. No. 11,004,894), entitled "MICRO-LED DISPLAYS," which is a continuation of U.S. patent application Ser. No. 16/233,787 (now U.S. Pat. No. 10,658,422), filed Dec. 27, 2018, entitled "MICRO-LED DISPLAYS," which is a division of U.S. patent application Ser. No. 15/283,180 (now U.S. Pat. No. 10,177,195), filed Sep. 30, 2016, entitled "MICRO-LED DISPLAYS." U.S. patent application Ser. No. 16/878,130, U.S. patent application Ser. No. 16/233,787, and U.S. patent application Ser. No. 15/283,180 are hereby incorporated by reference. Priority to U.S. patent application Ser. No. 16/878,130, U.S. patent application Ser. No. 16/233,787, and U.S. patent application Ser. No. 15/283,180 is hereby claimed.

TECHNICAL FIELD

The present disclosure relates to micro-LED displays.

BACKGROUND

Displays having microscopic light-emitting diodes (LEDs) are known as micro-LED, mLED, and μLED. As the name implies, micro-LED displays have arrays of micro-LEDs forming the individual pixel elements.

A pixel may be a minute area of illumination on a display screen, one of many from which an image is composed. In other words, pixels may be small discrete elements that together constitute an image as on a display. These primarily square or rectangular-shaped units may be the smallest item of information in an image. Pixels are normally arranged in a 2-dimensional grid, and are represented using dots, squares, or rectangles. Pixels may be the basic building blocks of a display or digital image and with geometric coordinates.

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

The present techniques relate to micro-LED displays and to manufacture of micro-LED displays to give lower cost and lower power consumption. A reduction in power consumption may be an objective of electronics design. Indeed, decreasing electrical consumption may be beneficial for mobile devices due to the generally limited power storage of mobile devices. Moreover, displays may consume a considerable portion (30%-70%) of the total power consumption of a mobile device such as with smartphones, smartwatches, and tablets.

Figure 1:
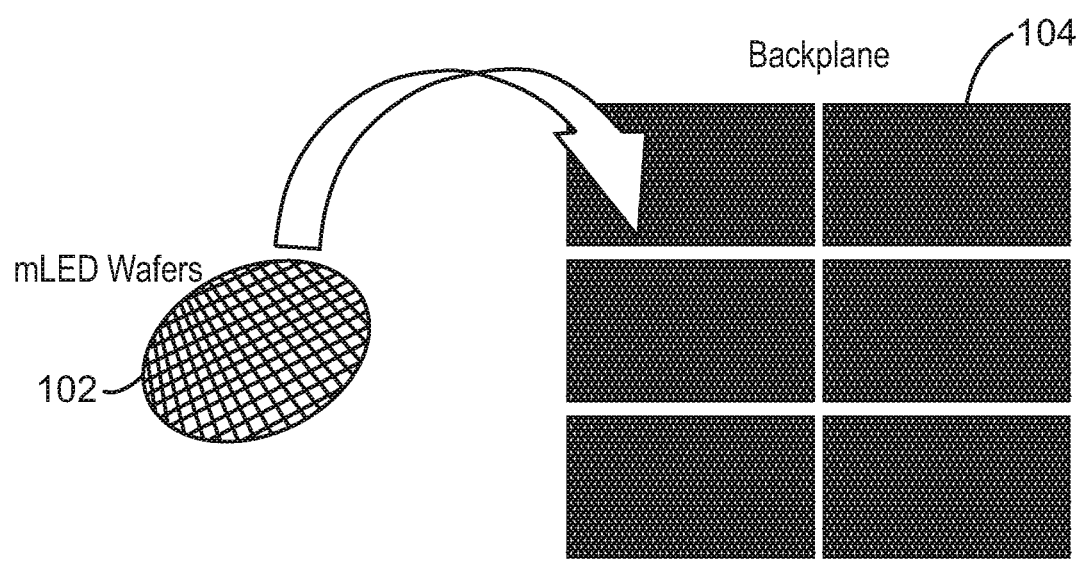
FIG. 1 is a diagrammatical representation of a micro-LED display panel manufacture.

FIG. 1 is a diagrammatical representation of a micro-LED display panel manufacture 100. A representation of micro-LED transfers generally from wafer 102 to glass backplane 104 is depicted in FIG. 1. To make active matrix micro-LED display panels, GaN-based micro-LEDs may be fabricated on wafers 102 (e.g., silicon or sapphire). The micro-LEDs may then be transferred from the wafers 102 to thin-film transistor (TFT) backplanes 104 to make pixels that form the active matrix micro-LED display panel. For a given pixel, the transfer process may be executed multiple times.

As will be discussed in greater detail below, some embodiments may reduce the number of separate transfers per pixel. This may also mean that the transfer time per pixel is reduced. Also, in some examples, the reduction in number of transfers may not result in an increase or significant increase of defects in the display panel.

Figure 2:
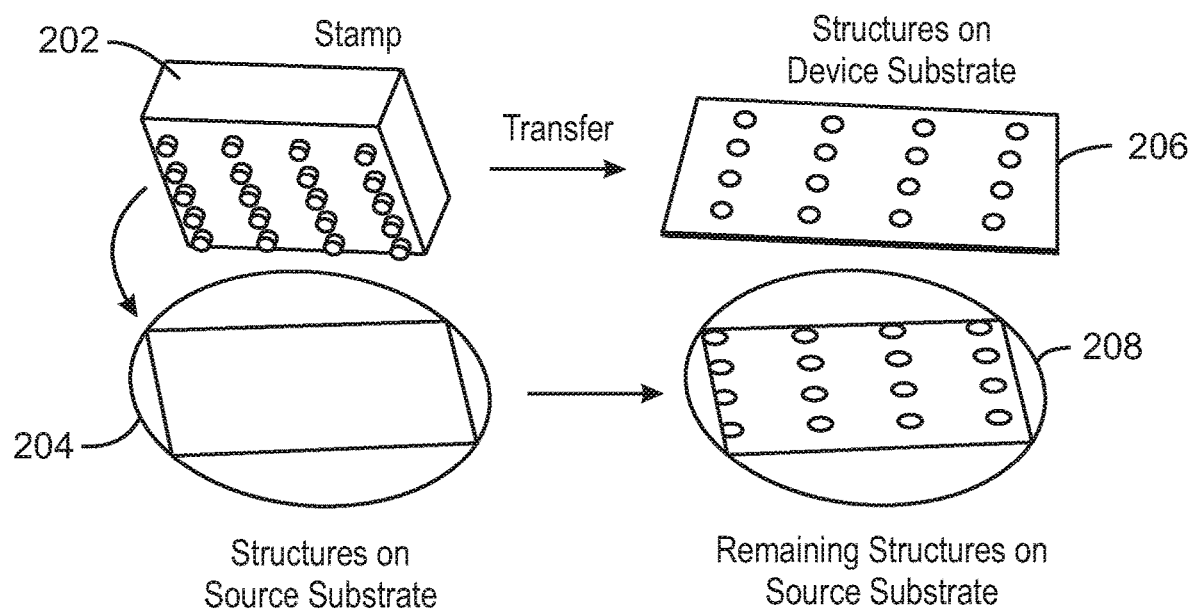
FIG. 2 is a diagrammatical representation of a micro-LED display panel manufacture.

FIG. 2 is a diagrammatical representation of a micro-LED display panel manufacture 200. A stamp 202 collects or "picks-up" micro-structures from the source substrate 204 which may be a native substrate with "printable" or "transferrable" micro-structures. In other words, the structures are transferred from the source substrate 204 onto the stamp 202. The micro-structures may be temporarily coupled (adhered or attached) to the stamp 202, for example, by Van der Waals forces. A micro-structure may be a micro-LED having multiple nanowires. On the other hand, as discussed below, a micro-structure may be two micro-LEDs grown monolithically (see, e.g., FIG. 7) and each with a plurality of nanowires.

The stamp 202 places, disperses, or prints the micro-structures onto a receiving device substrate 206. Indeed, a transfer places the collected structures onto the device substrate 206 leaving a partially-depleted source substrate 208 having remaining micro-structures not collected and transferred. The transfer process may be repeated and continue until most or all of the micro-structures on the source substrate 204 are transferred to the device substrate 206. In general, in micro-transfer, a stamp 202 may be utilized to transfer microscale devices from their native substrates (e.g., 204) onto non-native substrates (e.g., 206).

The production cost of micro-LED displays may be sensitive to the transfer tact time of micro-LEDs from source wafers 102 to host-glass TFT backplanes 104 (see FIG. 1), including for large-size displays such as with tablets or notebooks. Moreover, defect density after such transfer should generally be less than 1 part per million (ppm) for some micro-LED panels. Some embodiments may combine some of these transfers (and therefore reduce the number of transfers without adversely affecting quality of the micro-LED display panel) by growing monolithically two types of micro-LEDs on the same source wafer (e.g., growing monolithically both blue and green micro-LEDs on the same source wafer).

Micro-LEDs may be made from nanowires with an inner core of gallium nitride (GaN) and an outer layer of indium-gallium-nitride (InGaN). Increasing the diameter of the nanowires may increase the indium content of the nanowires and the micro-LED, thereby affecting the color emission of the micro-LED. The indium composition in InGaN to emit blue to red may be over a relatively large range from about 20% (e.g., +/−3%) to about 41% (e.g., +/−3%). The term "monolithic" may be seen as formed or integrated as a single unit.

For example, the present techniques may monolithically grow two micro-LEDs (one for a first color and one for a second color) with a relatively narrow range of indium compositions on the same wafer. For instance, a blue (B) nanowire LED and green (G) nanowire LED may be monolithically grown on a wafer to give BG nanowire LEDs, which is a micro-structure having a B micro-LED and a G micro-LED. This BG nanowire microstructure has a first diameter for B nanowires (B micro-LED) and a second diameter for G nanowires (G micro-LED), for example, where G nanowires have less diameter than that of B nanowires. The diameter for B may give about 20% indium content, and the diameter for G may give about 31% indium content. Another example grows monolithically a green (G) nanowire LED and a red (R) nanowire LED to give GR nanowire LEDs with one diameter giving about 31% indium content for G and another diameter giving about 41% indium content for R.

Figure 3:
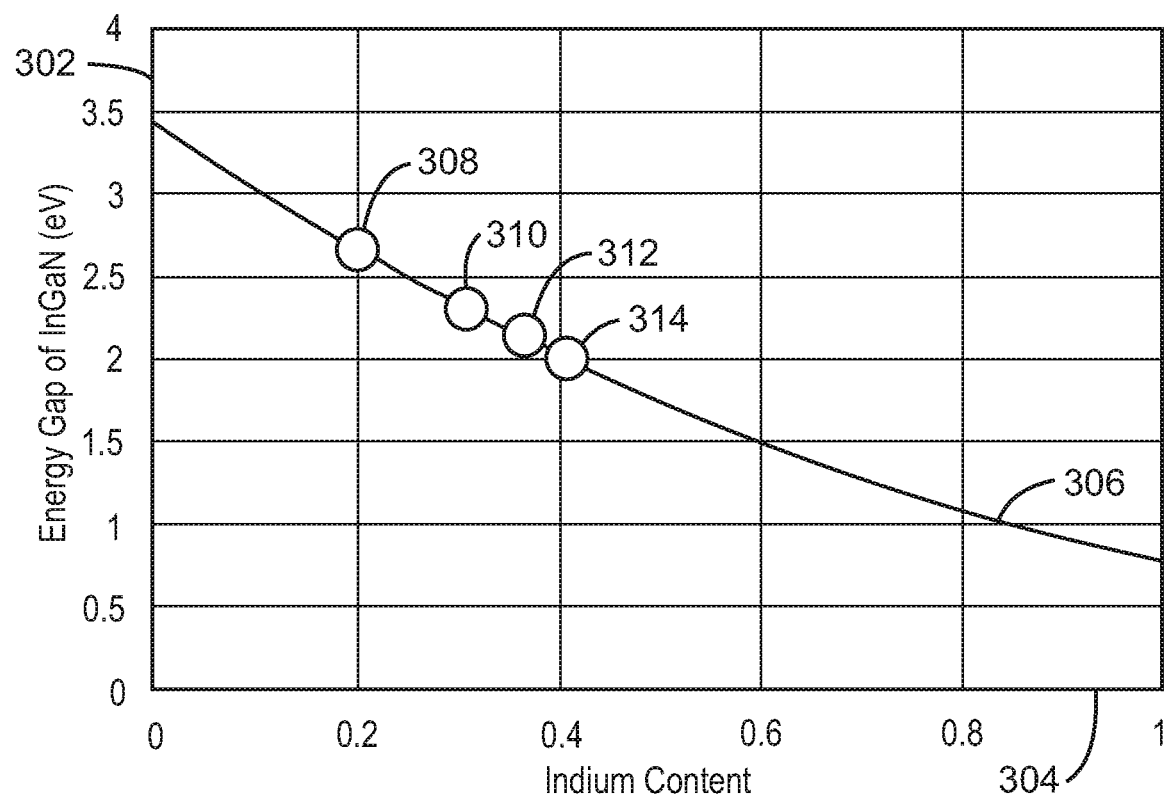
FIG. 3 is a graph of energy gap of indium GaN versus indium content of the indium GaN.

FIG. 3 is a graph 300 of energy gap 302 of InGaN in electronvolts (eV) versus the mass fraction of indium content 304 in the InGaN. Thus, the curve 306 is energy gap (eV) of InGaN over mass fraction range of indium content from 0 to 1. An indium content 304 of zero is GaN with no indium. An indium content 304 of 1 is indium with no GaN. As depicted, the circle 308 represents blue (B) at about 21% indium content. The circle 310 represents green (G) at about 31% indium content. Circle 312 represents yellow (Y) at about 37% indium content. Lastly, the circle 314 represents red (R) at about 41% indium content.

Again, some embodiments monolithically grow two-color LEDs with relatively narrow range of indium compositions on the same wafer. In other words, two different color micro-LEDs are grown monolithically at the same time on the same wafer. For instance, as mentioned, by using nanowires, the emission color may be changed from blue to red with increasing nanowire diameter. Some examples are to monolithically grow blue and green nanowire LEDs (for the pixel), monolithically grow green and red nanowire LEDs (for the pixel), and transfer separately a B micro-LED, the B and G micro-LEDs (monolithically grown), G and R micro-LEDs (monolithically grown), and a R micro-LED from wafers 102 to display backplanes 104 (see FIG. 1). Benefits of some embodiments may include lower cost and reduced defects of the micro-LED display panels, and generally increased power efficacy of two colors with close indium composition in the InGaN materials.

Thus, monolithic productions of blue and green nanowire LEDs are performed simultaneously on the same wafer by using different nanowire core diameters to change the indium composition in the InGaN active emitting junction. Such may occur during a latter portion of the growth. In other words, the change in diameter to impact indium content may be implemented to the InGaN layer which may occur after the growth of the GaN core.

Since the indium composition for blue and green are about 20% and about 31%, respectively, the same metalorganic vapor phase epitaxy (MOVPE) process parameters for each color may be satisfactory to produce adequate power efficacy for both blue and green LEDs at the same time. Likewise, because the indium composition for green and red are about 31% and about 41%, respectively, the same MOVPE process parameters for each color may be satisfactory to produce adequate power efficacy for both green and red LEDs at the same time.

Similarly, monolithic productions of green and yellow color LEDs may be performed simultaneously on the same wafer by using different nanowire core diameters to change the Indium composition in the InGaN active emitting junction later on. Since the Indium composition for green and yellow are about 31% and about 37%, respectively, the same MOVPE process parameters may be satisfactory to produce adequate power efficacy for both green and yellow LEDs at the same time. Also, monolithic productions of yellow and red color LEDs may be performed simultaneously on the same wafer by using different nanowire core diameters to change the Indium composition in the InGaN active emitting junction. The same MOVPE process parameters for each color may be satisfactory to produce adequate power efficacy for both yellow and red LEDs at the same time because the Indium compositions for green and yellow are close at about 37% and about 41%, respectively. Again, as indicated, the aforementioned various growths to change diameter may occur during a latter portion of the growth, affecting the InGaN layer after growth of the GaN core. In general, the above techniques may provide redundancy, as well as meeting cost and power efficacy targets.

Figure 4:
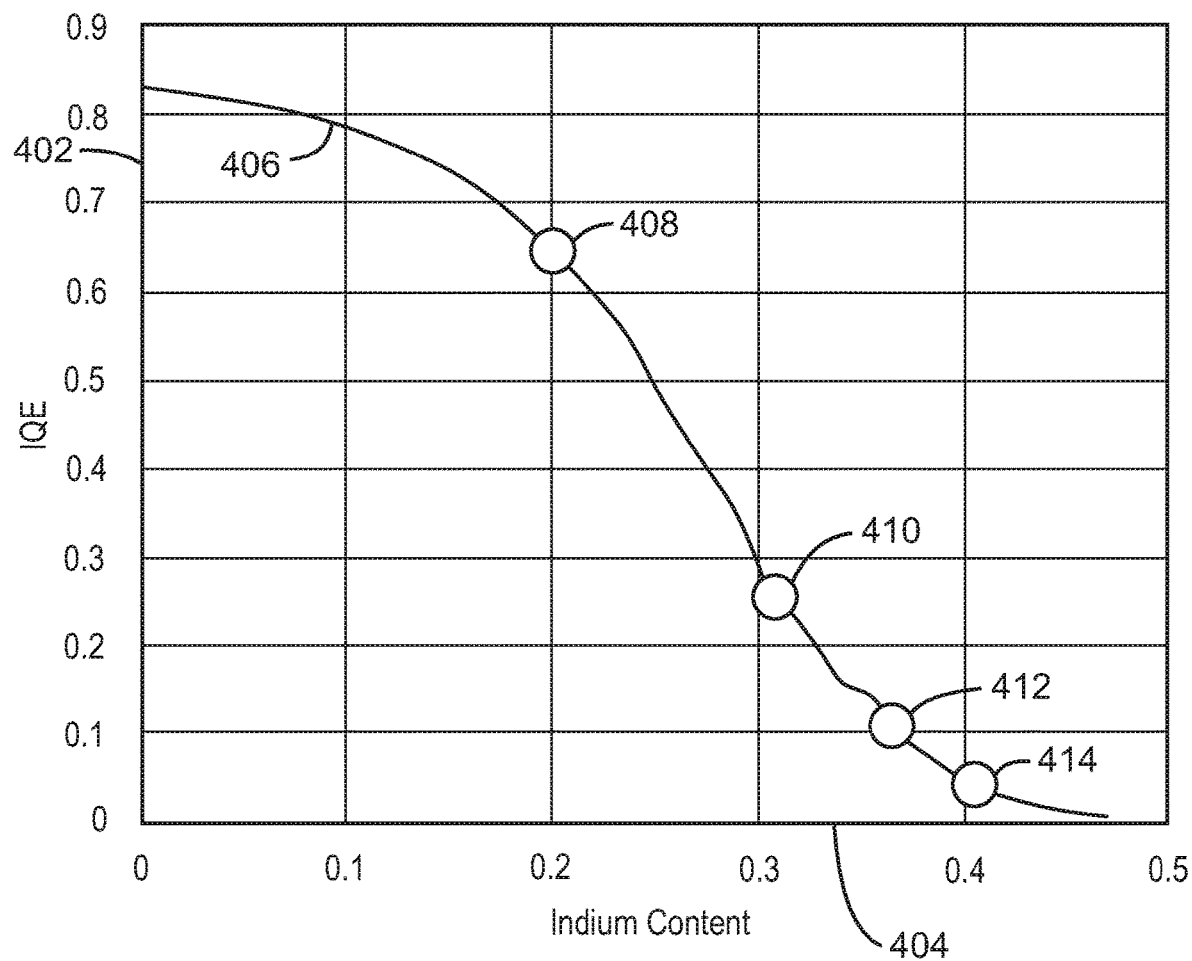
FIG. 4 is a graph of internal quantum efficiency of indium GaN versus indium content of the indium GaN.

FIG. 4 is a graph 400 for InGaN/GaN quantum well (QVV) LEDs and depicting internal quantum efficiency (IQE) 402 of InGaN versus the mass fraction of indium content 404 in the InGaN. Thus, the curve 406 is IQE of InGaN over the mass fraction range of indium content from 0 to 1. An indium content 404 of zero is GaN with no indium. An indium content 404 of 1 is indium with no GaN. Thus, the curve 406 is energy gap (eV) of InGaN over mass fraction range of indium content from 0 to 1. An indium content 300 of zero is GaN with no indium. An indium content 304 of 1 is indium with no GaN. As depicted, the circle 408 represents blue (B) at about 21% indium content. The circle 410 represents green (G) at about 31% indium content. Circle 412 represents yellow (Y) at about 37% indium content. Lastly, the circle 414 represents red (R) at about 41% indium content. As indicated above, the percentage indium for each color may vary within a tolerance such as +/−3%.

Figure 5:
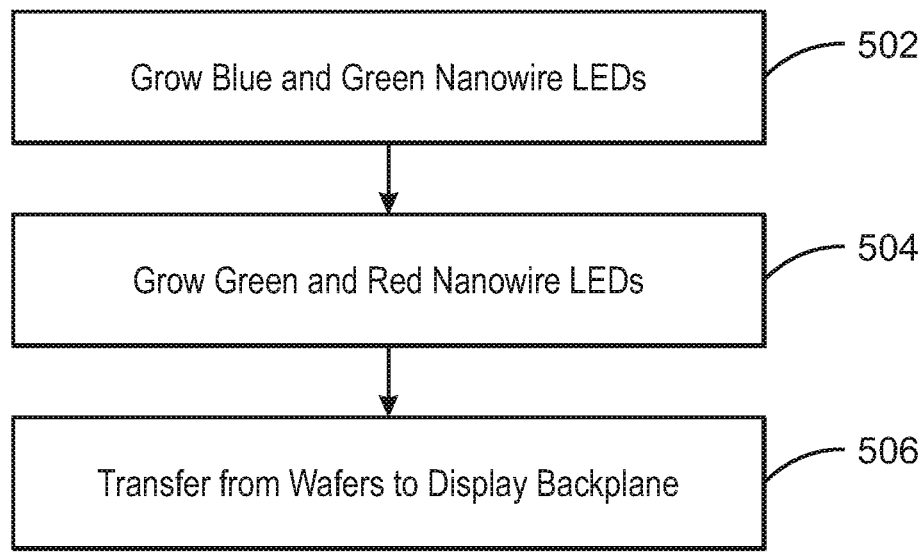
FIG. 5 is a block flow diagram of a method of forming a micro-LED display panel in accordance with embodiments of the present techniques.

FIG. 5 is a method 500 of forming a micro-LED display panel to have pixels which may be labeled as blue-green-red (BGR) pixels or RGB pixels, and so on. As discussed below, micro-LEDs as nanowire LEDs may be grown or formed on wafers, and then the micro-LEDs subsequently transferred from the wafers to a backplane for the micro-LED display panel. Moreover, each micro-LED generally has multiple nanowires. The diameter of each nanowire may be function of the desired color for the nanowire to emit. In other words, different diameters may have different indium content of InGaN in the nanowires.

At block 502, the method includes forming or growing monolithically both blue (B) nanowire LEDs and green (G) nanowire LEDs on a source wafer. The forming or growing includes growing indium gallium nitride (InGaN). Further, the growing monolithically may include forming nanowire LEDs, where some of the micro-LEDs have a first nanowire diameter such that they form blue micro-LEDs and other micro-LEDs have a second diameter greater than the first diameter such that they form green micro-LEDs. In other words, the first diameter (smaller diameter for B) gives a lower indium content, and the second diameter (larger diameter for G) gives a greater indium content.

At block 504, the method includes growing monolithically both green (G) nanowire LEDs and red (R) nanowire LEDs on a source wafer. The method may include growing other types of nanowire LEDs. For example, the method may include monolithically growing green (G) nanowire LEDs and yellow (Y) nanowire LEDs on a source wafer, monolithically growing yellow (Y) nanowire LEDs and red (R) nanowire LEDs on a source wafer, and the like. Again, monolithically growing may mean growing simultaneously on the same source wafer. Also, the method may include growing nanowire LEDs not monolithically grown with another color nanowire LED. For example, the method may include growing a blue (B) nanowire LED on a source wafer to give a B nanowire LED on the source wafer, growing a red (R) nanowire LED on a source wafer to give a R nanowire LED on the source wafer, and so on.

At block 506, the nanowire LEDs are transferred from the source wafer(s) to a backplane to form the micro-LED display panel with the backplane. Indeed, the method includes transferring a micro-structure having a blue nanowire LED and a green nanowire LED monolithically grown from a single source wafer to the backplane for a given pixel. The method may include transferring another micro-structure having a green nanowire LED and a red nanowire LED from a single source wafer to the backplane for the given pixel. The method may include transferring the blue nanowire LED (not monolithically grown) from its source wafer to the backplane for the given pixel, transferring the red nanowire LED (not monolithically grown) from its source wafer to the backplane, and the like. Other color integrated combinations and types of nanowire micro-LEDs formed may be transferred. In one example, the number of transfers for the pixel is not greater than four transfers: a transfer of a blue nanowire LED, a transfer of the blue-green nanowire LEDs micro-structure, a transfer of the green-red nanowire LEDs micro-structure, and a transfer of a red nanowire LED. Lastly, the method 500 may include forming the micro-LED display with the backplane, and forming or installing the micro-LED display panel in a display or electronic device.

With respect to FIG. 5, the method 500 of forming a micro-LED display panel at block 502 may more generally include growing monolithically (e.g., growing InGaN) a first color nanowire LED and a second color nanowire LED on a wafer to give a micro-structure having a first color micro-LED and a second color micro-LED, the second color different than the first color. As depicted in block 502, the colors may be first color as blue and the second color a green. However, other options are the first color as green and the second color as red, or the first color as green and the second color as yellow, or the first color as yellow and the second color as red, and so on. For the micro-structure, the method may include monolithically growing a first plurality of nanowires to a first diameter for the first color nanowire LED and a second plurality of nanowires to a second diameter for the second color nanowire LED, the second diameter larger than the first diameter.

At block 504, the method may more generally include growing monolithically a second color nanowire LED and a third color nanowire LED on another wafer to give a second micro-structure having a second color micro-LED and a third color micro-LED. As depicted in block 504, the second color may be green and the third color red. However, other color options are applicable.

At block 506, the method includes transferring this micro-structure (formed in block 502) from the wafer to a backplane for a pixel of the micro-LED display, and transferring the second micro-structure (formed in block 504) from the another wafer to the backplane for the pixel. In one example, the first color is blue, the second color is green, and the third color is red. Moreover, in some examples, the action in block 506 of performing transfers to the backplane for the pixel may include performing four separate transfers including the transferring of the first micro-structure from the wafer to the backplane, the transferring of the second micro-structure from the another wafer to the backplane, transferring a blue micro-LED comprising a blue nanowire LED to the backplane from a third wafer, and transferring a red micro-LED comprising a red nanowire LED to the backplane from a fourth wafer. Optionally, no more transfers than these four separate transfers are performed for the pixel.

As mentioned, nanowires are very small, such as, for example, about 2 micrometers height or length and about 10-500 nanometers in diameter. Nanowires for LEDs may be made of an inner core of gallium nitride (GaN) and a layer of indium-gallium-nitride (InGaN) on the outside, both of which are semiconducting materials.

In some examples, the nanowire architecture in contrast to planar LEDs may involve the growth of n-type GaN core followed by sequential "radial growth" of intrinsic InGaN and p-type GaN shells. In accordance with the present disclosure, processes for making nanowire micro-LEDs may involve a buffer epitaxial (EPI) wafer, nanoimprint lithography (NIL), nanowire EPI wafer, multiple quantum well (MQVV) EPI, micro LED patterning, contact, and the like. The techniques may be applied for small micro-LED screens (e.g., wearable watches, etc.) and devices with larger micro-LED screens (e.g., notebooks, tablets, etc.).

Figure 6:
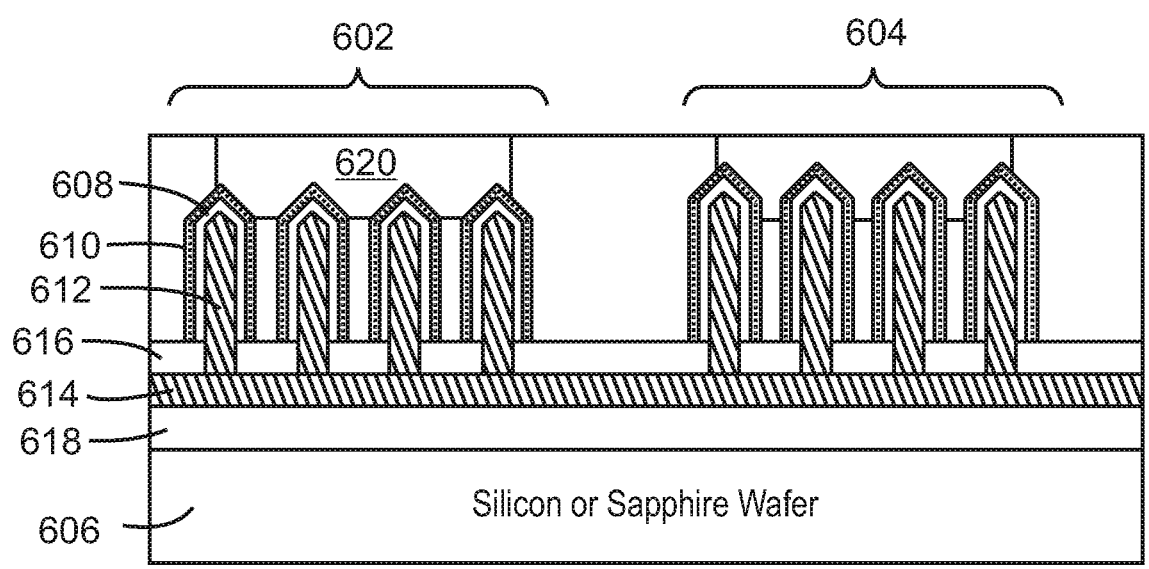
FIG. 6 is a diagram of a micro-structure having two micro-LEDs grown monolithically in accordance with embodiments of the present techniques.

FIG. 6 is an example micro-structure 600 having two micro-LEDs 602 and 604 grown monolithically at the same time on the same wafer 606. Therefore, the two micro-LEDs can be transferred together as a micro-structure 600 in a single transfer from the wafer 606 to a receiving or device substrate such as a backplane of a micro-LED display panel. Further, each micro-LED 602 and 604 is depicted as having four nanowires for clarity. The micro-LEDs 602 and 604 may each have more than four nanowires, and may have many more than four nanowires. Moreover, the first micro-LED 602 has nanowires with a first diameter so to emit a first color. The second micro-LED 604 has nanowires with a second diameter in order to emit a second color which is different than the first color. As discussed, the color emission may be a function of the indium content which may be affected by the nanowire diameter. Indeed, the diameter of a nanowire (having an InGaN layer or shell) can be increased during growth to increase the indium content and, therefore, change the color of the micro-LED 602 or 604. In some examples, the micro-LED 602 is a blue (B) micro-LED and the micro-LED 604 is a green (G) micro-LED. In other examples, the micro-LED 602 is a green (G) micro-LED and the micro-LED 604 is a red (R) micro-LED. In yet other examples, the micro-LED 602 is a yellow (Y) micro-LED and the micro-LED 604 is a red (R) micro-LED. In general, the micro-LED 602 is a first color micro-LED and the micro-LED 604 is a second color micro-LED, the second color different than the first color.

In the illustrated example, a nanowire has an inner shell 608 of InGaN and an outer shell 610 of p-GaN which may be GaN doped with a p-type dopant such as acceptor impurities (e.g., boron). The core 612 of the nanowire is n-GaN which may be GaN doped with a n-type dopant such as donor impurities (e.g., phosphorus). The shells 608 and 610 may be grown or formed on a mask 616 such as a silicon nitride (Si3N4) mask. The core 612 may be grown or formed on a n-GaN layer 614 and a buffer stack 618 such as aluminum gallium nitride (AlGaN), Si3N4, or other materials. Other configurations are applicable. Lastly, the multiple nanowires of a micro-LED 602 or 604 may share an electrode 620 (e.g., a transparent electrode). Thus, in the illustrated embodiment, multiple nanowires share the same electrode 620 to form a single micro-LED 602 or 604

Again, two micro-LEDs 602 and 604 (one for one color and the other for another color) may be transferred together from the source wafer 606 because the two different-color micro-LEDs were grown monolithically on the same wafer 606.

Figure 7:
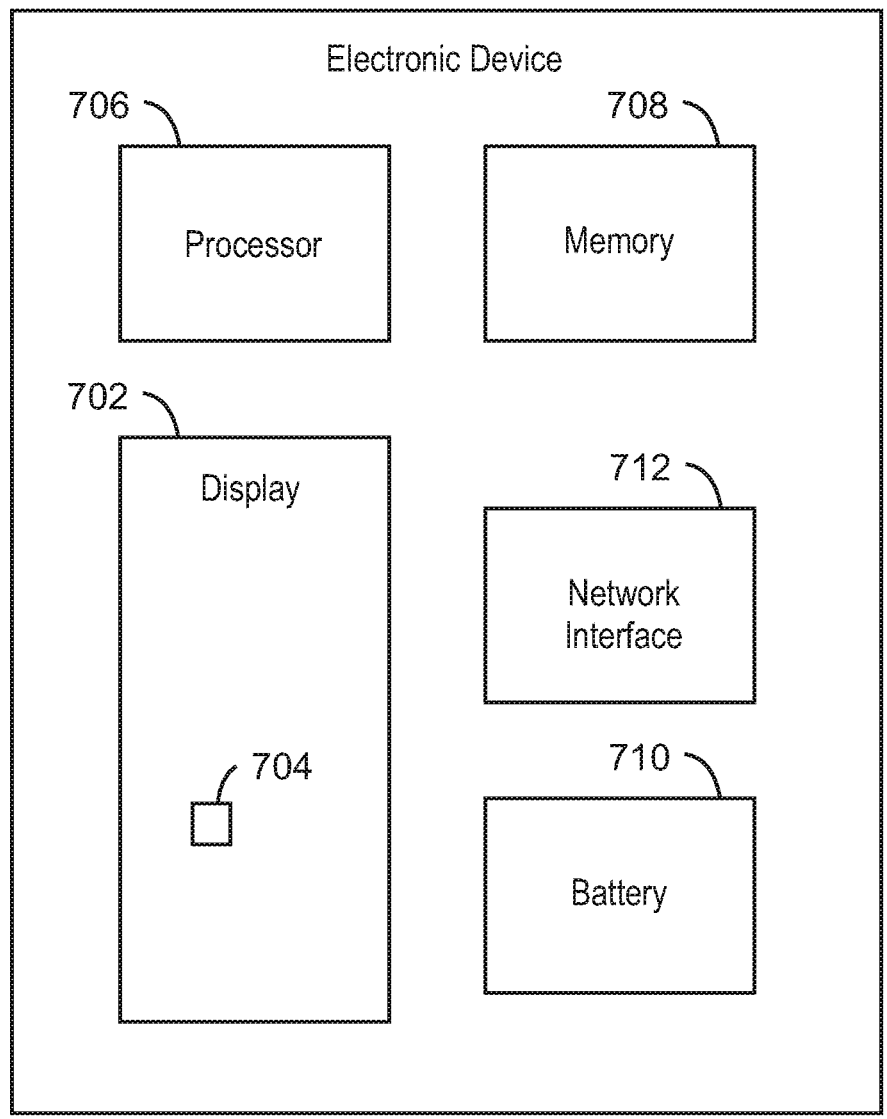
FIG. 7 is an electronic device having a display in accordance with embodiments of the present techniques.

FIG. 7 is an electronic device 700 having a display or display panel 702 with a micro-structure 704 (e.g., micro-structure 600 of FIG. 6) having two micro-LEDs that were grown monolithically at the same time on the same source wafer. The first micro-LED has nanowires with a first diameter (e.g., a first indium content) so to emit a first color. The second micro-LED has nanowires with a second diameter (e.g., a second indium content) so to emit second color which is different than the first color. Again, the nanowires in the micro-structure 704 for both micro-LEDs are grown together simultaneously or monolithically on the same wafer, but with the diameter of nanowires being different per micro-LED. In some examples for the micro-structure 704, the first micro-LED is a blue micro-LED and the second micro-LED is a green micro-LED. In other examples for the micro-structure 704, the first micro-LED is a green micro-LED and the second micro-LED is a red micro-LED. In yet other examples for the micro-structure 704, the first micro-LED is a yellow micro-LED and the second micro-LED is a red micro-LED. Other color examples are applicable.

The display may also have glass layers and other layers, circuitry, and so forth. The display panel 702 may be a micro-LED display panel. As should be apparent, only one microstructure 704 is depicted for clarity, though a display panel 702 will have an array or arrays of microstructures comprising nanowire LEDs.

The electronic device 700 may be a mobile device such as smartphone, tablet, notebook, smartwatch, and so forth. The electronic device 700 may be a computing device, stand-alone display, television, display monitor, vehicle computer display, the like. Indeed, the electronic device 700 may generally be any electronic device having a display or display panel.

The electronic device 700 may include a processor 706 (e.g., a central processing unit or CPU) and memory 708. The memory 708 may include volatile memory and non-volatile memory. The processor 706 or other controller, along with executable code store in the memory 708, may provide for touchscreen control of the display and well as for other features and actions of the electronic device 700.

In addition, the electronic device 700 may include a battery 710 that powers the electronic device including the display panel 702. The device 700 may also include a network interface 712 to provide for wired or wireless coupling of the electronic to a network or the internet. Wireless protocols may include Wi-Fi (e.g., via an access point or AP), Wireless Direct®, Bluetooth®, and the like. Lastly, as is apparent, the electronic device 700 may include additional components including circuitry and other components.

The micro-LED display panel 702 of the electronic device 700 may have a monolithically grown micro-structure including a first color micro-LED that is a first plurality of nanowires and a second color micro-LED that is a second plurality of nanowires, the second color different than the first color. The first plurality of nanowires has nanowires with a first diameter, and the second plurality of nanowires has nanowires with a second diameter different than the first diameter. For example, if the first color is blue and the second color is green, the second diameter would be larger than the first diameter. Further, the micro-LED display panel 702 may have a monolithically-grown second micro-structure including a second color micro-LED that is a third plurality of nanowires and a third color micro-LED that is a fourth plurality of nanowires. In some examples, the first color is blue, the second color is green, and the third color is red.

An embodiment may include a micro-LED display panel having a blue-green (BG) micro-structure including a blue (B) micro-LED (having a first plurality of nanowires) and a green (G) micro-LED (having a second plurality of nanowires) grown monolithically for a pixel of the display panel. Further, the micro-LED display panel may include a green-red (GR) micro-structure having a green (G) micro-LED (having a third plurality of nanowires) and a red (R) micro-LED (having a fourth plurality of nanowires) grown monolithically for the same or different pixel. The micro-LED display panel may include a second blue (B) micro-LED (having a fifth plurality of nanowires) and a second red (R) micro-LED (having a sixth plurality of nanowires) for the same or different pixel. Indeed, a single pixel of the micro-LED display panel may include the BG micro-structure, the GR micro-structure, the second B micro-LED, and the second R micro-LED.

Another embodiment is an electronic device with a micro-LED display panel having a pixel which may be labeled as a BGR or RGB pixel, wherein the pixel includes a blue-green LED micro-structure having a blue nanowire LED and a green nanowire LED grown monolithically. The pixel may include a green-red LEDs micro-structure having a green nanowire LED and a red nanowire LED grown monolithically. Further, the pixel may include a second blue nanowire LED and a second red nanowire LED.

Yet another embodiment (see, e.g., FIG. 5) includes a method of forming a micro-LED display panel having pixels which may be labeled as BGR or RGB pixels. The method may include forming the micro-LED display panel with a backplane. The method may include installing the micro-LED display panel in a display.

To form LEDs on a source wafer, the method may include growing monolithically a blue nanowire LED and a green nanowire LED on the same wafer to give a micro-structure having a blue micro-LED and a green micro-LED. In other words, a first plurality of nanowires may be grown to a first diameter for blue nanowire LED and a second plurality of nanowires grown to a second diameter for the green nanowire LED, the second diameter larger than the first diameter. The method includes transferring the micro-structure from the wafer to a backplane for a pixel which may be labeled as a BGR or RGB pixel, wherein the micro-structure to provide emission colors of blue (B) and green (G). The method may include growing monolithically a green nanowire LED and a red nanowire LED on a wafer to give a green-red micro-structure having a green micro-LED and a red micro-LED, and transferring the green-red micro-structure to the backplane for the pixel. Further, the method may include growing a red nanowire LED as a red micro-LED and transferring the red micro-LED to the backplane for the pixel. The method may include growing a blue nanowire LED as a blue micro-LED and transferring the blue micro-LED to the backplane for the pixel. The aforementioned growing of nanowires and micro-LEDS may include growing indium gallium nitride (InGaN).

In addition, the method may include performing four separate transfers to the backplane for the pixel, including transferring the blue (B) nanowire LED to the backplane, transferring the BG micro-structure to the backplane, transferring the GR micro-structure to the backplane, and transferring the red (R) nanowire LED to the backplane. In particular example, no more transfers than these four separate transfers are performed for the pixel. However, the method may include growing monolithically a green nanowire LED and a yellow nanowire LED to give a micro-structure having a green micro-LED and a yellow micro-LED, and transferring that micro-structure to the backplane. Further, the method may include growing monolithically a yellow nanowire LED and a red nanowire LED to give a another micro-structure, and transferring that microstructure to the backplane.

Yet another embodiment (see, e.g., FIG. 5) is a method of manufacturing a micro-LED display panel having pixels, including: growing monolithically a blue (B) nanowire LED and a green (G) nanowire LED to give a BG micro-structure having a B micro-LED and a G micro-LED; growing monolithically a green (G) nanowire LED and a red (R) nanowire LED to give a GR micro-structure having a G micro-LED and a R micro-LED; growing a blue (B) nanowire LED comprising a B micro-LED; growing a red (R) nanowire LED comprising a R micro-LED; and performing four separate transfers to a backplane substrate for a pixel of the micro-LED display panel, including a first transfer of the B micro-LED, a second transfer of a BG micro-structure, a third transfer of the GR micro-structure, and a fourth transfer of the R micro-LED. In certain examples, no more transfers than the four separate transfers are performed for the pixel. The method may include forming the micro-LED display panel with the backplane substrate. Lastly, the method may include installing the micro-LED display panel in a display of an electronic device such as a mobile device.

In the description and claims, the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit or receive signals, among others.

An embodiment is an implementation or example. Reference in the specification to "an embodiment", "one embodiment", "some embodiments", "various embodiments", or "other embodiments" means that a particular feature, structure, or characteristic described in connection with the embodiments is included in at least some embodiments, but not necessarily all embodiments, of the present techniques. The various appearances of "an embodiment", "one embodiment", or "some embodiments" are not necessarily all referring to the same embodiments. Elements or aspects from an embodiment can be combined with elements or aspects of another embodiment.

Not all components, features, structures, characteristics, etc. described and illustrated herein need be included in a particular embodiment or embodiments. If the specification states a component, feature, structure, or characteristic "may", "might", "can", or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement or order of circuit elements or other features illustrated in the drawings or described herein need not be arranged in the particular way illustrated and described. Many other arrangements are possible according to some embodiments.

In each system shown in a figure, the elements in some cases may each have a same reference number or a different reference number to suggest that the elements represented could be different or similar. However, an element may be flexible enough to have different implementations and work with some or all of the systems shown or described herein. The various elements shown in the figures may be the same or different. Which one is referred to as a first element and which is called a second element is arbitrary.

Examples are given. Example 1 is a method of forming a micro-light emitting diode (LED) display panel. The method includes growing monolithically a first color nanowire LED and a second color nanowire LED on a wafer to give a micro-structure having a first color micro-LED and a second color micro-LED, the second color different than the first color; and transferring the micro-structure from the wafer to a backplane for a pixel of the micro-LED display, wherein the micro-structure to provide emission colors of the first color and the second color.

Example 2 includes the method of example 1, including or excluding optional features. In this example, growing monolithically comprises growing a first plurality of nanowires to a first diameter for the first color nanowire LED and a second plurality of nanowires to a second diameter for the second color nanowire LED, the second diameter larger than the first diameter.

Example 3 includes the method of any one of examples 1 to 2, including or excluding optional features. In this example, the method includes growing monolithically a second color nanowire LED and a third color nanowire LED on another wafer to give a second micro-structure having a second color micro-LED and a third color micro-LED, and transferring the second micro-structure from the another wafer to the backplane for the pixel. Optionally, growing monolithically comprises growing indium gallium nitride (InGaN), and wherein performing transfers to the backplane for the pixel comprises performing four separate transfers comprising the transferring of the first micro-structure from the wafer to the backplane, the transferring of the second micro-structure from the another wafer to the backplane, transferring a blue micro-LED comprising a blue nanowire LED to the backplane from a third wafer, and transferring a red micro-LED comprising a red nanowire LED to the backplane from a fourth wafer. Optionally, no more transfers than the four separate transfers are performed for the pixel. Optionally, the first color is blue, the second color is green, and the third color is red.

Example 4 includes the method of any one of examples 1 to 3, including or excluding optional features. In this example, the method includes forming the micro-LED display panel with the backplane, wherein the first color is blue and the second color is green.

Example 5 includes the method of any one of examples 1 to 4, including or excluding optional features. In this example, the first color is green and the second color is red.

Example 6 includes the method of any one of examples 1 to 5, including or excluding optional features. In this example, the first color is green and the second color is yellow.

Example 7 includes the method of any one of examples 1 to 6, including or excluding optional features. In this example, the first color is yellow and the second color is red.

Example 8 includes the method of any one of examples 1 to 7, including or excluding optional features. In this example, the method includes growing a first color nanowire LED comprising a first color micro-LED on another wafer and transferring the first color micro-LED from the another wafer to the backplane for the pixel.

Example 9 is a method of forming a micro-light emitting diode (LED) display panel having pixels. The method includes growing monolithically a blue (B) nanowire LED and a green (G) nanowire LED to give a BG micro-structure having a B micro-LED and a G micro-LED; growing monolithically a green (G) nanowire LED and a red (R) nanowire LED to give a GR micro-structure having a G micro-LED and a R micro-LED; growing a blue (B) nanowire LED comprising a B micro-LED; growing a red (R) nanowire LED comprising a R micro-LED; and performing four separate transfers to a backplane substrate for a pixel of the micro-LED display panel, comprising separate respective transfers of the B micro-LED, the BG micro-structure, the GR micro-structure, and the R micro-LED.

Example 10 includes the method of example 9, including or excluding optional features. In this example, no more transfers than the four separate transfers are performed for the pixel.

Example 11 includes the method of any one of examples 9 to 10, including or excluding optional features. In this example, the method includes forming the micro-LED display panel with the backplane substrate.

Example 12 includes the method of any one of examples 9 to 11, including or excluding optional features. In this example, the method includes installing the micro-LED display panel in a display of an electronic device.

Example 13 is a micro-light emitting diode (LED) display panel. The micro-light emitting diode (LED) display panel includes a monolithically grown micro-structure comprising: a first color micro-LED comprising a first plurality of nanowires; and a second color micro-LED comprising a second plurality of nanowires, the second color different than the first color.

Example 14 includes the micro-light emitting diode (LED) display panel of example 13, including or excluding optional features. In this example, the micro-light emitting diode (LED) display panel includes a monolithically-grown second micro-structure comprising a second color micro-LED comprising a third plurality of nanowires and a third color micro-LED comprising a fourth plurality of nanow- ires. Optionally, the first color is blue, the second color is green, and the third color is red.

Example 15 includes the micro-light emitting diode (LED) display panel of any one of examples 13 to 14, including or excluding optional features. In this example, the first plurality of nanowires comprises nanowires with a first diameter, wherein the second plurality of nanowires comprises nanowires having a second diameter larger than the first diameter, and wherein the first color is blue and the second color is green.

Example 16 includes the micro-light emitting diode (LED) display panel of any one of examples 13 to 15, including or excluding optional features. In this example, the first color is green and the second color is red.

Example 17 includes the micro-light emitting diode (LED) display panel of any one of examples 13 to 16, including or excluding optional features. In this example, the first color is green and the second color is yellow.

Example 18 includes the micro-light emitting diode (LED) display panel of any one of examples 13 to 17, including or excluding optional features. In this example, the first color is yellow and the second color is red.

Example 19 is an electronic device. The electronic device includes a micro-light emitting diode (LED) display panel comprising a pixel, wherein the pixel comprises a monolithically grown blue-green (BG) LED micro-structure comprising a blue (B) nanowire LED and a green (G) nanowire LED.

Example 20 includes the electronic device of example 19, including or excluding optional features. In this example, the pixel comprises a monolithically grown green-red (GR) LED micro-structure comprising a green (G) nanowire LED and a red (R) nanowire LED. Optionally, the pixel comprises a second blue (B) nanowire LED and a second red (R) nanowire LED.

Example 21 is a method of forming a micro-light emitting diode (LED) display panel. The method includes growing monolithically a first color nanowire LED and a second color nanowire LED on a wafer to give a micro-structure having a first color micro-LED and a second color micro-LED, the second color different than the first color, wherein growing monolithically comprises growing a first plurality of nanowires to a first diameter for the first color nanowire LED and a second plurality of nanowires to a second diameter for the second color nanowire LED, the second diameter larger than the first diameter; and transferring the micro-structure from the wafer to a backplane for a pixel of the micro-LED display, wherein the micro-structure to provide emission colors of the first color and the second color.

Example 22 includes the method of example 21, including or excluding optional features. In this example, the method includes growing monolithically a second color nanowire LED and a third color nanowire LED on another wafer to give a second micro-structure having a second color micro-LED and a third color micro-LED, and transferring the second micro-structure from the another wafer to the backplane for the pixel. Optionally, growing monolithically comprises growing indium gallium nitride (InGaN), and wherein performing transfers to the backplane for the pixel comprises performing four separate transfers comprising the transferring of the first micro-structure from the wafer to the backplane, the transferring of the second micro-structure from the another wafer to the backplane, transferring a blue micro-LED comprising a blue nanowire LED to the backplane from a third wafer, and transferring a red micro-LED comprising a red nanowire LED to the backplane from a fourth wafer. Optionally, the first color is blue, the second color is green, and the third color is red.

Example 23 includes the method of any one of examples 21 to 22, including or excluding optional features. In this example, the first color is blue and the second color is green, or wherein the first color is green and the second color is red, or wherein the first color is green and the second color is yellow, or wherein the first color is yellow and the second color is red.

Example 24 includes the method of any one of examples 21 to 23, including or excluding optional features. In this example, the method includes growing a first color nanowire LED comprising a first color micro-LED on another wafer and transferring the first color micro-LED from the another wafer to the backplane for the pixel; and forming the micro-LED display panel with the backplane, Example 25 is a method of forming a micro-light emitting diode (LED) display panel having pixels. The method includes growing monolithically a blue (B) nanowire LED and a green (G) nanowire LED to give a BG micro-structure having a B micro-LED and a G micro-LED; growing monolithically a green (G) nanowire LED and a red (R) nanowire LED to give a GR micro-structure having a G micro-LED and a R micro-LED; growing a blue (B) nanowire LED comprising a B micro-LED; growing a red (R) nanowire LED comprising a R micro-LED; and performing four separate transfers to a backplane substrate for a pixel of the micro-LED display panel, comprising separate respective transfers of the B micro-LED, the BG micro-structure, the GR micro-structure, and the R micro-LED.

Example 26 includes the method of example 25, including or excluding optional features. In this example, no more transfers than the four separate transfers are performed for the pixel.

Example 27 includes the method of any one of examples 25 to 26, including or excluding optional features. In this example, the method includes forming the micro-LED display panel with the backplane substrate.

Example 28 includes the method of any one of examples 25 to 27, including or excluding optional features. In this example, the method includes installing the micro-LED display panel in a display of an electronic device.

Example 29 is a micro-light emitting diode (LED) display panel. The micro-light emitting diode (LED) display panel includes a monolithically grown micro-structure comprising: a first color micro-LED comprising a first plurality of nanowires; and a second color micro-LED comprising a second plurality of nanowires, the second color different than the first color, wherein the first plurality of nanowires comprises nanowires with a first diameter, wherein the second plurality of nanowires comprises nanowires having a second diameter larger than the first diameter.

Example 30 includes the micro-light emitting diode (LED) display panel of example 29, including or excluding optional features. In this example, the micro-light emitting diode (LED) display panel includes a monolithically-grown second micro-structure comprising a second color micro-LED comprising a third plurality of nanowires and a third color micro-LED comprising a fourth plurality of nanowires. Optionally, the first color is blue, the second color is green, and the third color is red.

Example 31 includes the micro-light emitting diode (LED) display panel of any one of examples 29 to 30, including or excluding optional features. In this example, the first color is blue and the second color is green, or wherein the first color is green and the second color is red, or wherein the first color is green and the second color is yellow, or wherein the first color is yellow and the second color is red.

Example 32 includes the micro-light emitting diode (LED) display panel of any one of examples 29 to 31, including or excluding optional features. In this example, the micro-LED display panel is installed in an electronic device.

Example 33 is a system for forming a micro-light emitting diode (LED) display panel. The system includes means for growing monolithically a first color nanowire LED and a second color nanowire LED on a wafer to give a micro-structure having a first color micro-LED and a second color micro-LED, the second color different than the first color; and means for transferring the micro-structure from the wafer to a backplane for a pixel of the micro-LED display, wherein the micro-structure to provide emission colors of the first color and the second color.

Example 34 includes the system of example 33, including or excluding optional features. In this example, growing monolithically comprises growing a first plurality of nanowires to a first diameter for the first color nanowire LED and a second plurality of nanowires to a second diameter for the second color nanowire LED, the second diameter larger than the first diameter.

Example 35 includes the system of any one of examples 33 to 34, including or excluding optional features. In this example, the system includes means for growing monolithically a second color nanowire LED and a third color nanowire LED on another wafer to give a second micro-structure having a second color micro-LED and a third color micro-LED, and means for transferring the second micro-structure from the another wafer to the backplane for the pixel. Optionally, growing monolithically comprises growing indium gallium nitride (InGaN), and wherein means for performing transfers to the backplane for the pixel comprises means for performing four separate transfers comprising the transferring of the first micro-structure from the wafer to the backplane, the transferring of the second micro-structure from the another wafer to the backplane, transferring a blue micro-LED comprising a blue nanowire LED to the backplane from a third wafer, and transferring a red micro-LED comprising a red nanowire LED to the backplane from a fourth wafer. Optionally, no more transfers than the four separate transfers are performed for the pixel. Optionally, the first color is blue, the second color is green, and the third color is red.

Example 36 includes the system of any one of examples 33 to 35, including or excluding optional features. In this example, the system includes means for forming the micro-LED display panel with the backplane, wherein the first color is blue and the second color is green.

Example 37 includes the system of any one of examples 33 to 36, including or excluding optional features. In this example, the first color is green and the second color is red.

Example 38 includes the system of any one of examples 33 to 37, including or excluding optional features. In this example, the first color is green and the second color is yellow.

Example 39 includes the system of any one of examples 33 to 38, including or excluding optional features. In this example, the first color is yellow and the second color is red.

Example 40 includes the system of any one of examples 33 to 39, including or excluding optional features. In this example, the system includes means for growing a first color nanowire LED comprising a first color micro-LED on another wafer and means for transferring the first color micro-LED from the another wafer to the backplane for the pixel.

Example 41 is a system for forming a micro-light emitting diode (LED) display panel having pixels. The system includes means for growing monolithically a blue (B) nanowire LED and a green (G) nanowire LED to give a BG micro-structure having a B micro-LED and a G micro-LED; means for growing monolithically a green (G) nanowire LED and a red (R) nanowire LED to give a GR micro-structure having a G micro-LED and a R micro-LED; means for growing a blue (B) nanowire LED comprising a B micro-LED; means for growing a red (R) nanowire LED comprising a R micro-LED; and means for performing four separate transfers to a backplane substrate for a pixel of the micro-LED display panel, comprising separate respective transfers of the B micro-LED, the BG micro-structure, the GR micro-structure, and the R micro-LED.

Example 42 includes the system of example 41, including or excluding optional features. In this example, no more transfers than the four separate transfers are performed for the pixel.

Example 43 includes the system of any one of examples 41 to 42, including or excluding optional features. In this example, the system includes means for forming the micro-LED display panel with the backplane substrate.

Example 44 includes the system of any one of examples 41 to 43, including or excluding optional features. In this example, the system includes means for installing the micro-LED display panel in a display of an electronic device.

Example 45 is a method of forming a micro-light emitting diode (LED) display panel. The method includes growing monolithically a blue (B) and green (G) nanowire LED on a wafer; and transferring the BG nanowire LED from the wafer to a backplane for a pixel of the micro-LED display panel, wherein the BG nanowire LED to provide emission colors of blue (B) and green (G).

Example 46 includes the method of example 45, including or excluding optional features. In this example, growing monolithically comprises growing a first diameter of a first nanowire for the BG nanowire LED and growing a second diameter of a second nanowire for the BG nanowire LED, the second diameter larger than the first diameter.

Example 47 includes the method of any one of examples 45 to 46, including or excluding optional features. In this example, growing monolithically comprises growing indium gallium nitride (InGaN).

Example 48 includes the method of any one of examples 45 to 47, including or excluding optional features. In this example, the method includes growing monolithically a green (G) and red (R) nanowire LED, and transferring the GR nanowire LED to the backplane for the pixel.

Example 49 includes the method of any one of examples 45 to 48, including or excluding optional features. In this example, the method includes growing a red (R) nanowire LED and transferring the R nanowire LED to the backplane for the pixel.

Example 50 includes the method of any one of examples 45 to 49, including or excluding optional features. In this example, the method includes growing a blue (B) nanowire LED and transferring the B nanowire LED to the backplane for the pixel.

Example 51 includes the method of any one of examples 45 to 50, including or excluding optional features. In this example, the method includes growing monolithically a green (G) and red (R) nanowire LED, and transferring the GR nanowire LED to the backplane for the pixel; and performing four separate transfers to the backplane for the pixel, comprising the transferring of the BG nanowire LED, transferring of the GR nanowire LED to the backplane, transferring of a blue (B) nanowire LED to the backplane, and transferring a red nanowire LED to the backplane. Optionally, the method includes growing the B nanowire LED and growing the R nanowire LED. Optionally, no more transfers than the four separate transfers are performed for the pixel.

Example 52 includes the method of any one of examples 45 to 51, including or excluding optional features. In this example, the method includes growing monolithically a green (G) and yellow (Y) nanowire LED, and transferring the GY nanowire LED to the backplane.

Example 53 includes the method of any one of examples 45 to 52, including or excluding optional features. In this example, the method includes growing monolithically a yellow (Y) and red (R) nanowire LED, and transferring the YR nanowire LED to the backplane.

Example 54 includes the method of any one of examples 45 to 53, including or excluding optional features. In this example, the method includes forming the micro-LED display panel with the backplane.

Example 55 includes the method of any one of examples 45 to 54, including or excluding optional features. In this example, the method includes installing the micro-LED display panel in a display.

It is to be understood that specifics in the aforementioned examples may be used anywhere in one or more embodiments. For instance, all optional features of the computing device described above may also be implemented with respect to either of the methods described herein or a computer-readable medium. Furthermore, although flow diagrams or state diagrams may have been used herein to describe embodiments, the present techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. A micro-light emitting diode (LED) display panel comprising:
   a backplane; and
   at least two of:
      a first micro-LED including a first plurality of nanowires, the first micro-LED to emit a first color of light;
      a second micro-LED including a second plurality of nanowires, the second micro-LED to emit a second color of light different than the first color; or
      a third micro-LED including a third plurality of nanowires, the third micro-LED to emit a third color of light different than the first color and different than the second color, the at least two of the first micro-LED, the second micro-LED or the third micro-LED included in an integrated LED structure supported by the backplane.

2. The micro-LED display panel of claim 1, further including at least two of:
   a fourth micro-LED, the fourth micro-LED to emit the first color of light;
   a fifth micro-LED, the fifth micro-LED to emit the second color of light; or a sixth micro-LED, the sixth micro-LED to emit the third color of light, at least one of the fourth, fifth, or sixth micro-LEDs to emit a different color of light than the at least two of the first, second, or third micro-LEDs.

3. The micro-LED display panel of claim 1, wherein the display panel is associated with at least one of a smartphone, a tablet, a notebook, a smartwatch, or a television.

4. The micro-LED display panel of claim 1, wherein the backplane includes glass.

5. The micro-LED display panel of claim 1, wherein the integrated LED structure is a monolithic structure from a single wafer different than the backplane.

6. The micro-LED display panel of claim 1, wherein the first, second, and third colors are based on respective first, second, and third percentages of indium content in corresponding ones of the first, second, and third micro-LEDs, the second percentage of indium greater than the first percentage of indium, the third percentage of indium greater than the second percentage of indium.

7. The micro-LED display panel of claim 1, wherein the first color is blue, the second color is green, and the third color is red.

8. The micro-LED display panel of claim 7, further including a fourth micro-LED, the fourth micro-LED to emit yellow light.

9. The micro-LED display panel of claim 1, wherein the first plurality of nanowires have a first diameter, the second plurality of nanowires have a second diameter different than the first diameter, and the third plurality of nanowires have a third diameter different than the first diameter and different than the second diameter.

10. The micro-LED display panel of claim 9, wherein the third diameter is greater than the second diameter and the second diameter is greater than the first diameter.

11. The micro-LED display panel of claim 1, wherein the first plurality of nanowires share an electrode.

12. The micro-LED display panel of claim 1, further including a non-native substrate, the integrated LED structure on the non-native substrate.

13. The micro-LED display panel of claim 12, wherein the non-native substrate is a substrate on which the integrated LED structure was not grown.

14. An electronic device comprising:
network interface circuitry; and
a micro-light emitting diode (LED) display panel including a pixel supported by a backplane, the pixel including a monolithic set of micro-LEDs, the monolithic set of micro-LEDs including at least two of a red (R) nanowire LED, a yellow (Y) nanowire LED, a green (G) nanowire LED, and a blue (B) nanowire LED.

15. The electronic device of claim 14, wherein the monolithic set of micro-LEDs is a first monolithic set of micro-LEDs, the pixel including a second monolithic set of micro-LEDs, the second monolithic set of micro-LEDs including at least two of a red (R) nanowire LED, a yellow (Y) nanowire LED, a green (G) nanowire LED, and a blue (B) nanowire LED, at least one of the micro-LEDs in the second monolithic set to emit a different color than colors emitted by the micro-LEDs in the first monolithic set of micro-LEDs.

16. The electronic device of claim 14, wherein the electronic device corresponds to a smartphone, a tablet, a notebook, a smartwatch, or a television.

17. The electronic device of claim 14, wherein the backplane includes glass.

18. The electronic device of claim 14, wherein the monolithic set is from a single wafer different than the backplane.

19. The electronic device of claim 14, wherein the red (R) nanowire LED includes a first plurality of nanowires having a first diameter, the yellow (Y) nanowire LED includes a second plurality of nanowires having a second diameter greater than the first diameter, the green (G) nanowire LED includes a third plurality of nanowires having a third diameter greater than the second diameter, and the blue (B) nanowire LED includes a fourth plurality of nanowires having a fourth diameter greater than the third diameter.

20. The electronic device of claim 19, wherein the first plurality of nanowires share an electrode.

* * * * *